(12) United States Patent
Wang

(10) Patent No.: US 8,525,713 B2
(45) Date of Patent: Sep. 3, 2013

(54) VOLTAGE CONVERTER

(76) Inventor: Ping-Ying Wang, Hsinchu (TW)

( * ) Notice: Subject to any disclaimer, the term of this patent is extended or adjusted under 35 U.S.C. 154(b) by 57 days.

(21) Appl. No.: 13/282,158

(22) Filed: Oct. 26, 2011

(65) Prior Publication Data

US 2012/0098686 A1  Apr. 26, 2012

(30) Foreign Application Priority Data

Oct. 26, 2010 (TW) .............................. 99136493 A

(51) Int. Cl.
*H03M 1/06* (2006.01)

(52) U.S. Cl.
USPC ........... 341/118; 341/119; 341/120; 341/143; 341/155; 341/164

(58) Field of Classification Search
USPC ................. 341/118, 120, 143, 144, 155, 164, 341/165
See application file for complete search history.

(56) References Cited

U.S. PATENT DOCUMENTS

| | | | | |
|---|---|---|---|---|
| 4,527,133 A * | 7/1985 | Money | | 341/143 |
| 5,727,023 A * | 3/1998 | Dent | | 375/244 |
| 6,084,538 A * | 7/2000 | Kostelnik et al. | | 341/120 |
| 6,225,937 B1 * | 5/2001 | Butler | | 341/169 |
| 6,507,301 B2 * | 1/2003 | Locher | | 341/143 |
| 6,545,624 B2 * | 4/2003 | Lee et al. | | 341/155 |
| 7,164,375 B2 * | 1/2007 | Sawada | | 341/143 |
| 7,230,561 B2 * | 6/2007 | Lee | | 341/172 |
| 7,362,246 B2 * | 4/2008 | Park et al. | | 341/118 |
| 7,369,067 B2 * | 5/2008 | Kishi et al. | | 341/53 |
| 7,489,791 B2 * | 2/2009 | Kunnen et al. | | 381/113 |
| 7,567,193 B2 * | 7/2009 | Ryu | | 341/143 |
| 8,248,280 B2 * | 8/2012 | Zhan et al. | | 341/118 |
| 2005/0024245 A1 * | 2/2005 | Sit et al. | | 341/119 |
| 2008/0055141 A1 * | 3/2008 | Ryu | | 341/144 |
| 2010/0097257 A1 * | 4/2010 | Edelson et al. | | 341/143 |
| 2012/0200440 A1 * | 8/2012 | Okada et al. | | 341/143 |

\* cited by examiner

*Primary Examiner* — Linh Nguyen
(74) *Attorney, Agent, or Firm* — Birch Stewart Kolasch & Birch, LLP

(57) ABSTRACT

A voltage converter for converting an analog input signal into a digital signal is provided. The pulse width of the digital signal is relative to the voltage level of the analog input signal. The voltage converter includes a comparator and a feedback module. After comparing the analog input signal and an analog feedback signal, the comparator generates the digital signal. When the analog input signal is higher than the analog feedback signal, the digital signal has a first voltage level. When the analog input signal is lower than the analog feedback signal, the digital signal has a second voltage level, which is different from the first voltage level. Based on the digital signal, the feedback module adjusts the analog feedback signal toward the analog input signal.

20 Claims, 13 Drawing Sheets

VOLTAGE CONVERTER

CROSS-REFERENCE TO RELATED APPLICATIONS

This application is based upon and claims the benefit of priority to Taiwanese Patent Application No. 099136493, filed on Oct. 26, 2010; the entire content of which is incorporated herein by reference for all purpose.

BACKGROUND

The present invention relates to voltage converting circuits. In particular, the present invention relates to analog-to-digital converters.

Compared with analog signals, digital signals can be more easily processed and stored. Therefore, analog-to-digital converters are important and widely used in communication systems, multimedia systems, and computer systems. At the present time, the architectures of analog-to-digital converters are generally complicated. Besides, most of the analog-to-digital converters include many capacitive components occupying huge areas in the chip. The hardware cost of analog-to-digital converters is accordingly high.

In practice, digital signals can be presented in various forms. Most of the existing analog-to-digital converters convert analog signals into binary bits. If a digital signal with the other form is required, the following circuit has to further convert the digital signal provided by the analog-to-digital converter.

SUMMARY

To solve the aforementioned problems, voltage converters capable of providing a digital signal with pulse-width corresponding to the amplitude of an analog signal are proposed in the invention. The voltage converters can also further include a pulse-width-to-digital converting circuit, so as to provide two digital signals with different forms simultaneously. Moreover, the architecture of the voltage converters according to the invention is simple and can be implemented easily. The hardware cost of analog-to-digital converters can accordingly be reduced. Compared with prior arts, the voltage converters according to the invention are simpler, cheaper, and capable of providing more than one kind of digital signal.

One embodiment according to the invention is a voltage converter for converting an analog input signal to a digital signal. The pulse-width of the digital signal is related to the amplitude of the analog input signal. The voltage converter includes a comparator and a feedback module. The comparator compares the analog input signal and an analog feedback signal, so as to generate the digital signal. When the analog input signal is higher than the analog feedback signal, the digital signal has a first voltage level. When the analog input signal is lower than the analog feedback signal, the digital signal has a second voltage level different from the first voltage level. The feedback module is used for adjusting the analog feedback signal based on the digital signal, so as to make the analog feedback signal approach the analog input signal.

Another embodiment according to the invention is a voltage converter for converting an original analog signal to a digital signal. The voltage converter includes a comparator and a level-adjusting module. The comparator compares an analog input signal and a reference voltage, so as to generate the digital signal. When the analog input signal is higher than the reference voltage, the digital signal has a first voltage level. When the analog input signal is lower than the reference voltage, the digital signal has a second voltage level different from the first voltage level. The level-adjusting module provides a basis voltage. The analog input signal is the sum of the default voltage and the original analog signal. The default voltage is designed such that the pulse-width of the digital signal is kept wider than a threshold.

Another embodiment according to the invention is a voltage converter for converting an analog input signal to a digital signal. The voltage converter includes a first converting module, a second converting module, a compensating module, and a comparing module. The first converting module generates a first digital signal based on the analog input signal and a clock signal. The phase of the first digital signal is related to the analog input signal. The second converting module generates a second digital signal based on a reference signal and the clock signal. The phase of the second digital signal is related to the reference signal. The compensating module provides a phase compensation to the first digital signal or the second digital signal. The comparing module compares the first digital signal and the second digital signal, so as to generate the digital signal. The phase compensation is designed such that the pulse-width of the digital signal is kept wider than a threshold.

Another embodiment according to the invention is an analog-to-digital converter including an analog-to-pulse-width converting module and a pulse-width-to-digital converting module. The analog-to-pulse-width converting module converts an analog input signal to a digital signal. The pulse-width of the digital signal is related to the amplitude of the analog input signal. The pulse-width-to-digital converting module generates a digital output signal corresponding to the pulse-width of the digital signal.

Another embodiment according to the invention is an analog-to-digital converter including an analog-to-digital converting module, a reference current source, a capacitor, an error estimating module, and a correcting module. The analog-to-digital converting module converts an analog input signal to a digital output signal. The reference current source charges the capacitor, so as to generate a default reference signal as the analog input signal. The error estimating module is used for measuring the digital output signal generated based on the default reference signal and comparing the digital output signal with a standard digital signal, so as to generate an estimated error. The correcting module corrects the digital output signal based on the estimated error.

The advantage and spirit of the invention may be understood by the following recitations together with the appended drawings.

DETAILED DESCRIPTION

Figure 1A:
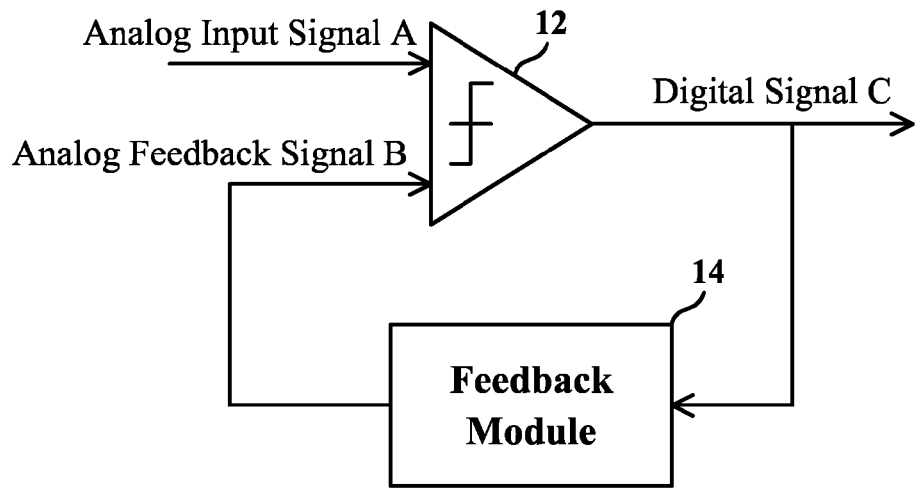
FIG. 1(A) shows the block diagram of the voltage converter in one embodiment according to the invention.

One embodiment according to the invention is the voltage converter shown in FIG. 1(A). This voltage converter includes a comparator 12 and a feedback module 14. As shown in FIG. 1(A), after comparing the analog input signal A and the analog feedback signal B outputted from the feedback module 14, the comparator 12 generates a digital signal C. When the analog input signal A is higher than the analog feedback signal B, the digital signal C has a first voltage level $V_1$. When the analog input signal A is lower than the analog feedback signal B, the digital signal C has a second voltage level $V_2$ different from the first voltage level $V_1$. In the following description, the condition that the first voltage level $V_1$ is high and the second voltage level $V_2$ is low is taken as an example.

Figure 1B:
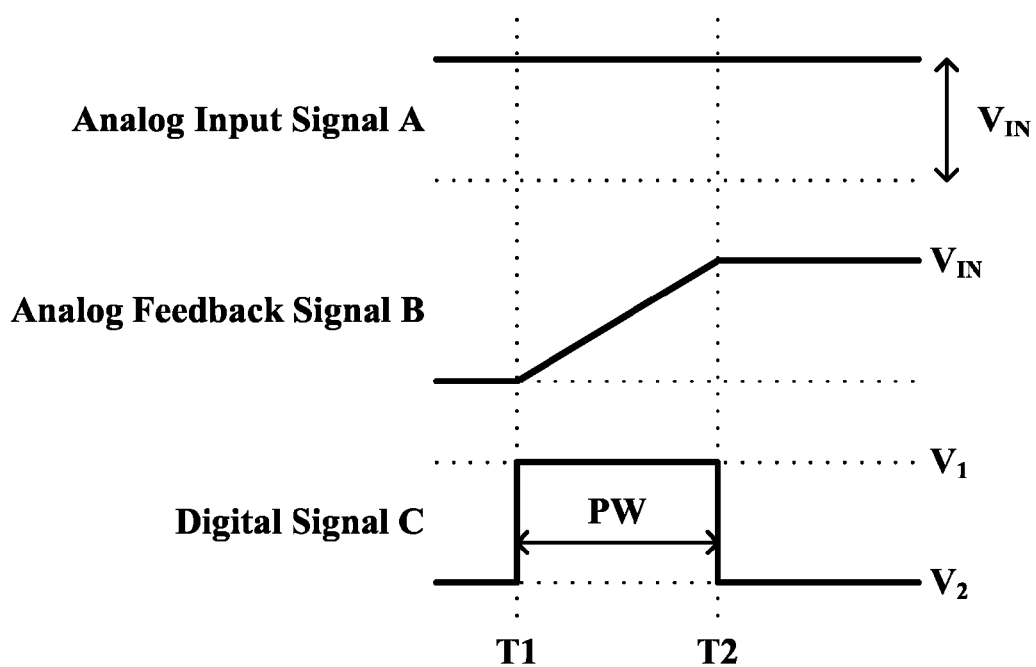
FIG. 1(B) and FIG. 1(C) are exemplary timing diagrams of the signals in the voltage converter.

Based on the digital signal C, the feedback module 14 adjusts the analog feedback signal B, so as to make the analog feedback signal B approach the analog input signal A. When the digital signal C has the first voltage level $V_1$, the feedback module 14 increases the analog feedback signal B. On the contrary, when the digital signal C has the second voltage level $V_2$, the feedback module 14 decreases the analog feedback signal B. FIG. 1(B) illustrates an exemplary timing diagram of the three aforementioned signals. In this example, the analog input signal A has a voltage level equal to $V_{IN}$. At time instant T1, the comparator 12 starts to compare the analog input signal A and the analog feedback signal B. Because the analog feedback signal B at this time is lower than $V_{IN}$, the digital signal C has the first voltage level $V_1$ at time instant T1. Based on this digital signal C, the feedback module 14 continuously raises the voltage of the analog feedback signal B. After the analog feedback signal B is substantially equal to or slightly higher than $V_{IN}$, the voltage of the digital signal C becomes the second voltage level $V_2$. As shown in FIG. 1(B), the falling edge appears at time instant T2 (i.e. when the analog input signal A and the analog feedback signal B are substantially equal.)

Figure 1C:
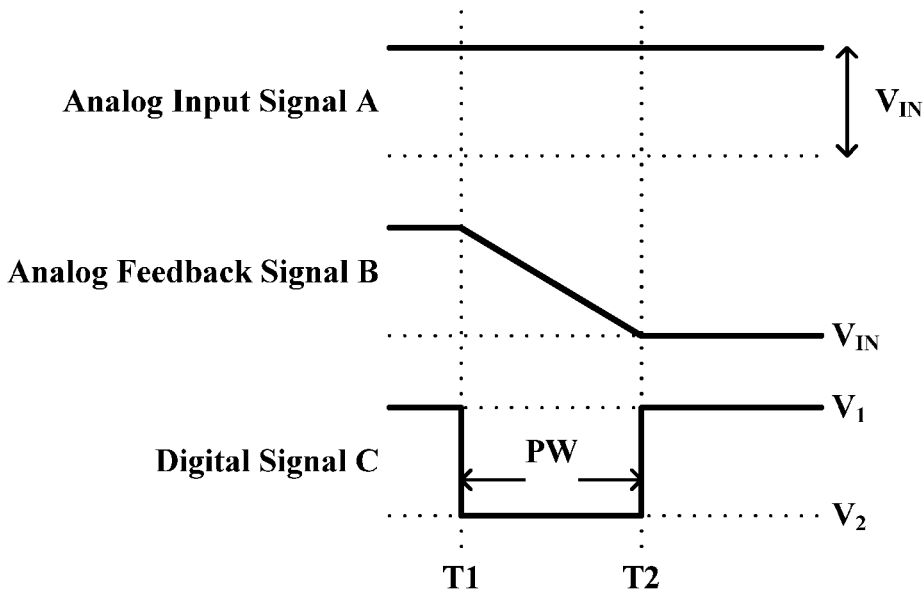

FIG. 1(C) sows another exemplary timing diagram. In this example, the analog input signal A also has the voltage level $V_{IN}$. At time instant T1, the comparator 12 starts to compare the analog input signal A and the analog feedback signal B. Because the analog feedback signal B at this time is higher than $V_{IN}$, the digital signal C has the second voltage level $V_2$ at time instant T1. Based on this digital signal C, the feedback module 14 continuously reduces the voltage of the analog feedback signal B. After the analog feedback signal B is substantially equal to or slightly lower than $V_{IN}$, the voltage of the digital signal C becomes the first voltage level $V_1$. As shown in FIG. 1(C), the rising edge appears at time instant T2 (i.e. when the analog input signal A and the analog feedback signal B are substantially equal.)

For the circuit shown in FIG. 1(A), the larger the initial difference between the analog input signal A and the analog feedback signal B is, the longer the time duration required by making the analog feedback signal B approach the analog input signal A (i.e. the duration labeled as PW in FIG. 1(B) and FIG. 1(C)) is. In other words, the pulse-width of the digital signal C is related to the amplitude of the analog input signal A. It should be noted that if the first voltage level $V_1$ is low and the second voltage level $V_2$ is high, the same function can be achieved.

Figure 2A:
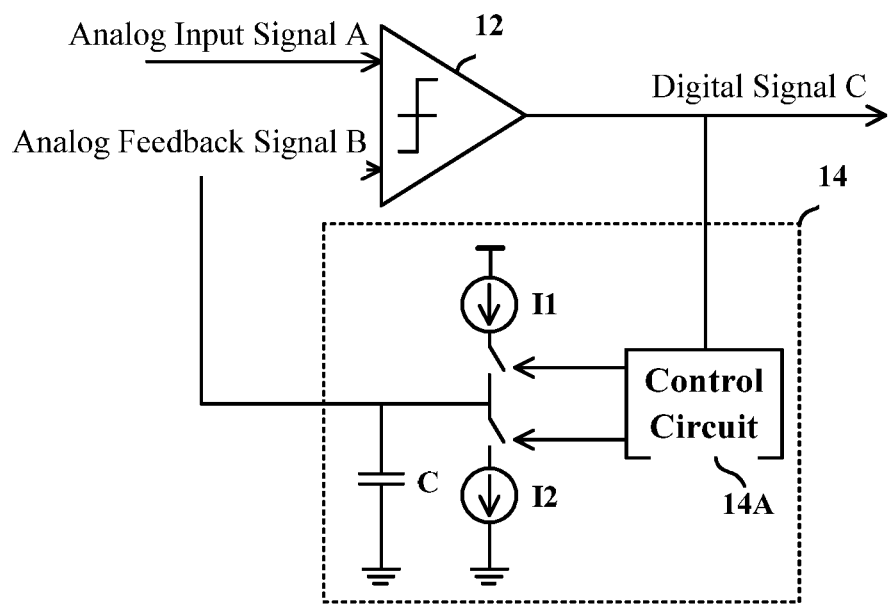
FIG. 2(A) and FIG. 2(B) further show detailed examples of the feedback module according to the invention.

FIG. 2(A) shows a detailed example of the feedback module 14. The feedback module 14 herein includes two current sources, a capacitive component C, and a control circuit 14A. The capacitive component C is coupled between an input end of the comparator 12 and the ground node. After the comparator 12 starts to compare the analog input signal A and the analog feedback signal B, the control circuit 14A connects the first current source I1 to the capacitive component C, so as to charge the capacitive component C and raise the analog feedback signal B if the digital signal C has the first voltage level $V_1$. After the transition edge from the first voltage level $V_1$ to the second voltage level $V_2$ appears in the digital signal C, the control circuit 14A cuts the connection between the first current source I1 and the capacitive component C.

If the digital signal C has the second voltage level $V_2$, the control circuit 14A connects the second current source I2 to the capacitive component C, so as to discharge the capacitive component C and reduce the analog feedback signal B. After the transition edge from the second voltage level $V_2$ to the first voltage level $V_1$ appears in the digital signal C, the control circuit 14A cuts the connection between the second current source I2 and the capacitive component C. In practice, a clock circuit can be used for synchronizing the operation of the comparator 12 and the control circuit 14A.

Figure 2B:
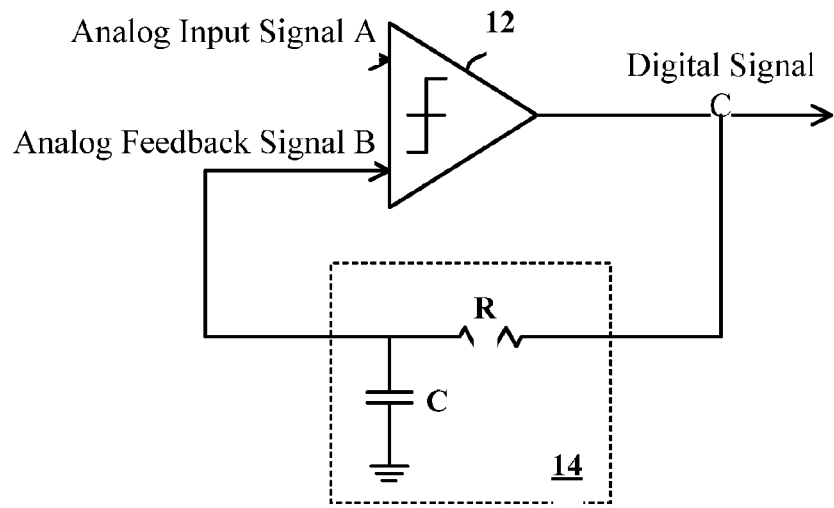

FIG. 2(B) shows another detailed example of the feedback module 14. The feedback module 14 herein is a low-pass filter including a resistor and a capacitor. The analog feedback signal B is generated by filtering the digital signal C. In this example, if the analog input signal A is higher than the analog feedback signal B, the digital signal C has the high voltage level $V_1$ and this high voltage charges the capacitor in the low-pass filter. Accordingly, the analog feedback signal B is raised gradually. After the analog feedback signal B is equal to or slightly higher than the analog input signal A, the digital signal C is changed to the low voltage level $V_2$. It can be seem the low-pass filter in FIG. 2(B) does provide the function of the feedback module 14 illustrated in FIG. 2(A). In other words, the low-pass filter is capable of assisting in generating a digital signal C with pulse-width related to the amplitude of the analog input signal A.

Figure 3:
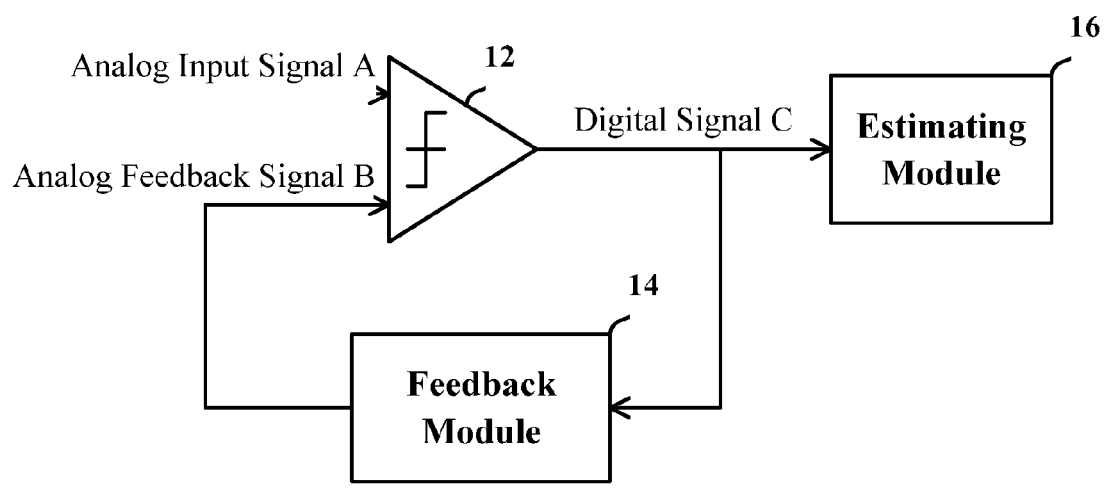
FIG. 3 shows an example for further including an estimating module in the voltage converter according to the invention.

Since the pulse-width of the digital signal C is related to the amplitude of the analog input signal A, the voltage converter can further include an estimating module 16 (shown in FIG. 3) for estimating the voltage value of the analog input signal A based on the pulse-width of the digital signal C. FIG. 1(B) can be an example. It is assumed the rate of increasing or decreasing the analog feedback signal B by the feedback module 14 is substantially fixed. The time instant T1 is known. As long as the time instant T2 or the length of the duration PW can be found, the voltage difference between the analog input signal A and the initial analog feedback signal B can be estimated based on the aforementioned rate and the duration PW. In other words, according to an initial feedback voltage and the digital signal C, the estimating module 16 can estimate the value of $V_{IN}$. More specifically, the initial feedback voltage is corresponding to the initial status of the analog feedback signal B. It is noted the voltage $V_{IN}$ can be either higher or lower than the initial feedback voltage.

Figure 4A:
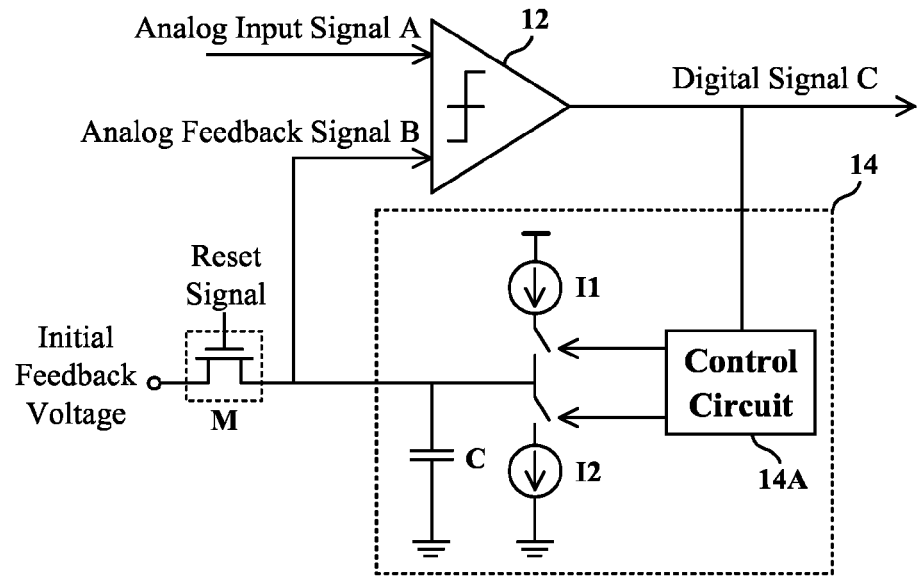
FIG. 4(A) through FIG. 4(D) show the examples for further including a reset module in the voltage converter according to the invention.

In practice, the initial feedback voltage may be the voltage generated based on the previous analog input signal A and kept in the capacitive component C. In one embodiment, the initial feedback voltage is a specific voltage set by circuits. FIG. 4(A) illustrates an example that a reset module is further included. In this example, the reset module M is a switch. Before the voltage converter starts to convert the analog input signal A, the switch is turned on and the analog feedback signal B is reset to an initial feedback voltage. The initial feedback voltage can be a given value decided based on actual requirements. The estimating module 16 or the other circuit receiving the digital signal C can take this initial feedback voltage as a reference value.

Figure 4B:
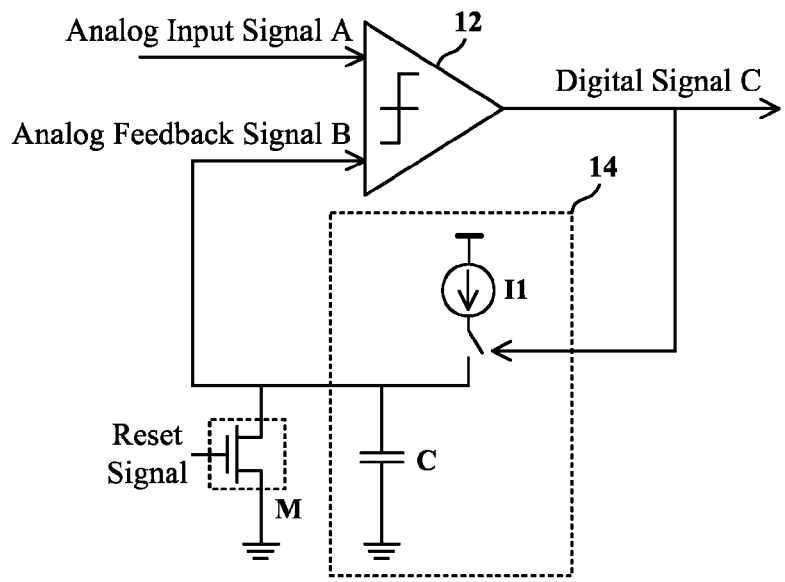
Figure 4C:
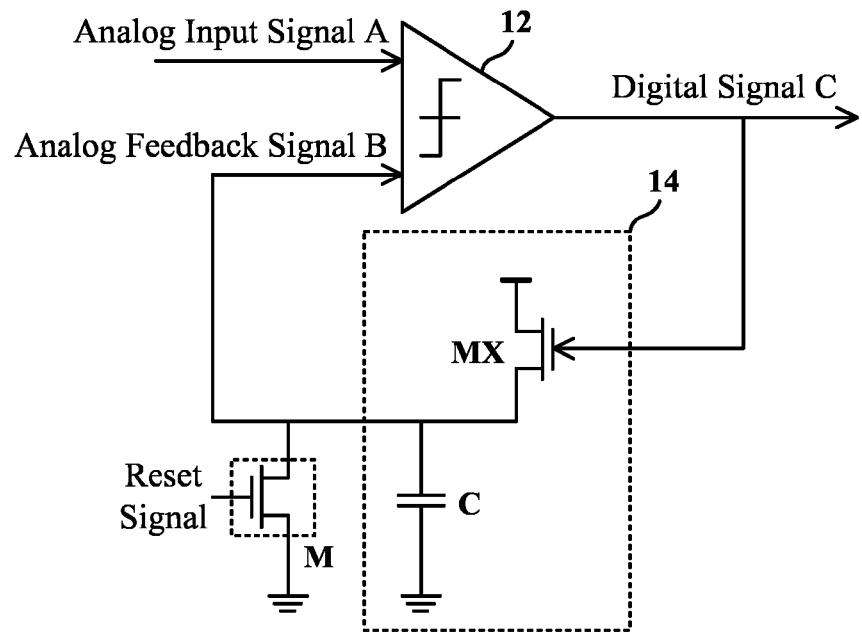

FIG. 4(B) illustrates an example of setting the initial feedback voltage to zero. In this example, the feedback module 14 includes a capacitor C and a charge current source I1. When the switch in the reset module M is turned on by the reset signal, both the two ends of the capacitor C are connected to the ground and the analog feedback signal B is set to zero. Assuming the voltage $V_{IN}$ of the analog input signal A is higher than zero, the digital signal C definitely has the first voltage level $V_1$ when the comparator 12 starts to compare the analog input signal A with the analog feedback signal B. The charge current source I1 in this example charges the capacitor C when the digital signal C has the first voltage level $V_1$. Accordingly, the analog feedback signal B will be continuously raised until the analog feedback signal B is equal to or slightly higher than the voltage $V_{IN}$ (i.e. until the digital signal C does not have the first voltage level $V_1$ any more.) FIG. 4(C) shows an exemplary embodiment of the charge current source I1. The charge current source I1 in this example is a transistor MX coupled to the power supply node.

Figure 4D:
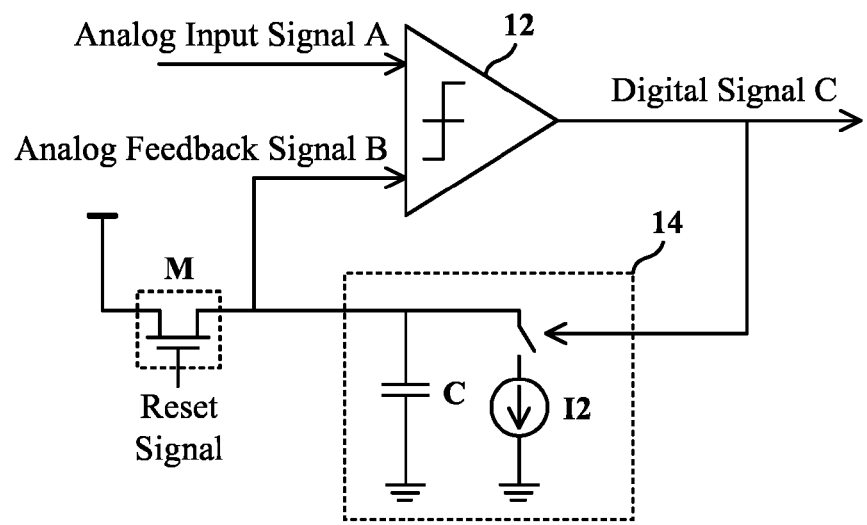

FIG. 4(D) illustrates an example of setting the initial feedback voltage to the power supply voltage. In this example, the feedback module 14 includes a capacitor C and a discharge current source I2. When the switch in the reset module M is turned on by the reset signal, the capacitor C is connected between the power supply node and the ground node, so as to set the analog feedback signal B to the supply voltage. Assuming the voltage $V_{IN}$ of the analog input signal A is lower than the supply voltage, the digital signal C definitely has the second voltage level $V_2$ when the comparator 12 starts to compare the analog input signal A with the analog feedback signal B. The discharge current source I2 in this example discharges the capacitor C when the digital signal C has the second voltage level $V_2$. Accordingly, the analog feedback signal B will be continuously reduced until the analog feedback signal B is equal to or slightly lower than the voltage $V_{IN}$ (i.e. until the digital signal C does not have the second voltage level $V_2$ any more.)

As described above, the length of the duration PW is directly proportional to the difference between the analog input signal A and the initial voltage of the analog feedback signal B. To increase the convenience of measuring the length of duration PW, the initial voltage of the analog feedback signal B can be designed such that the pulse-width of the digital signal C (i.e. the length of the duration PW) is kept wider than a threshold. Taking the condition in FIG. 4(D) as an example, the initial voltage of the analog feedback signal B can be purposely designed as higher than the voltage $V_{IN}$ and has a voltage difference large enough. In this way, the time instant T2 is postponed, and the length of the duration PW is accordingly increased.

Figure 5:
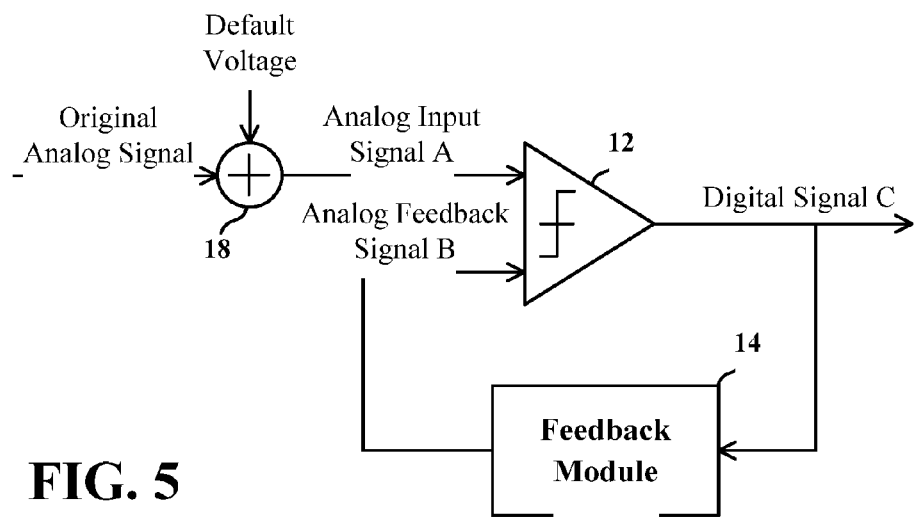
FIG. 5 shows an embodiment capable of changing the pulse-width of the digital signal.

FIG. 5 shows another embodiment for changing the pulse-width of the digital signal C. A level-adjusting module 18 is included. As shown in FIG. 5, the analog input signal A received by the comparator 12 is the sum of the basis voltage and an original analog signal. The actual target to be converted by the voltage converter is the original analog signal. With the level-adjusting module 18, the common-mode voltage of the original analog signal can be properly adjusted. For example, the basis voltage can be designed as capable of making the pulse-width of the digital signal C larger than a threshold value. Taking FIG. 4(C) as an example, as long as the voltage $V_{IN}$ of the analog input signal A is kept higher than zero and the voltage difference between $V_{IN}$ and zero is large enough, the length of the duration PW will not be too short. For instance, if the amplitude range of the original analog signal is −0.5V to +0.5V, the basis voltage can be set as +1V, so as to adjust the amplitude range of the analog input signal A to +0.5V to −1.5V. Correspondingly, the pulse-width of the digital signal C is increased. Since the basis voltage is known, the following circuit can still correctly estimate the amplitude of the original analog signal based on the pulse-width of the digital signal C.

Figure 6:
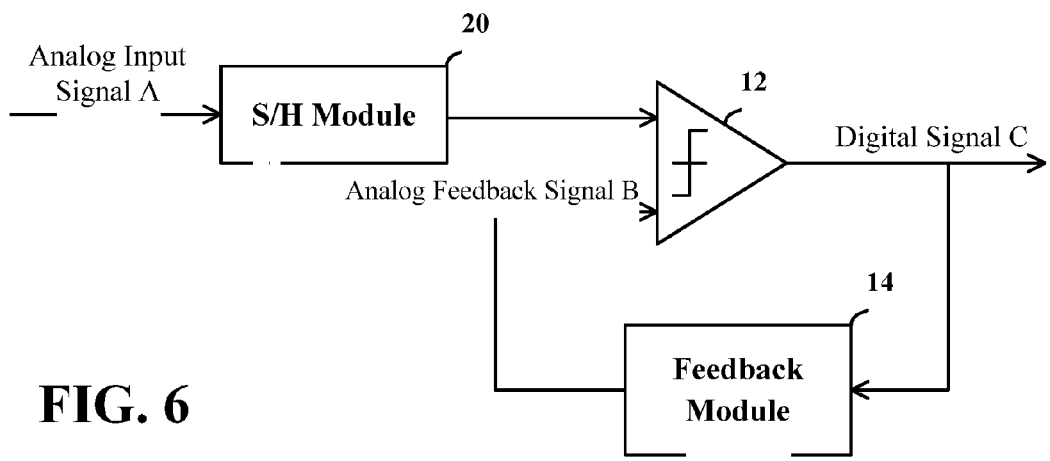
FIG. 6 shows an example for further including a sample-and-hold module in the voltage converter according to the invention.

FIG. 6 illustrates an example that a sample-and-hold (S/H) module is further included. As shown in FIG. 6, the S/H module 20 is coupled to the input end of the comparator 12. More specifically, the S/H module 20 is used for receiving the analog input signal A and maintaining the analog input signal A fixed, so as to ensure the stability of the input of the comparator 12 before the loop is locked.

Figure 7:
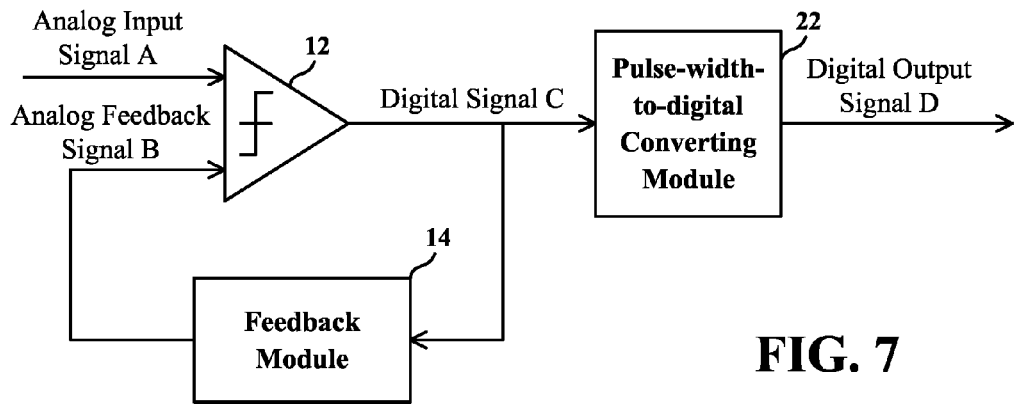
FIG. 7 shows an example for further including a pulse-width-to-digital converting module in the voltage converter according to the invention.

FIG. 7 illustrates an example that a pulse-width-to-digital converting module is further included. The pulse-width-to-digital converting module 22 is used for generating a digital output signal D corresponding to the pulse-width of the digital signal C. For example, the digital output signal D can be an eight-bit digital signal representing the amplitude of the analog input signal A. With the pulse-width-to-digital converting module 22, the voltage converter according to the invention can provide two digital signals (C and D) with different forms at the same time.

Figure 8A:
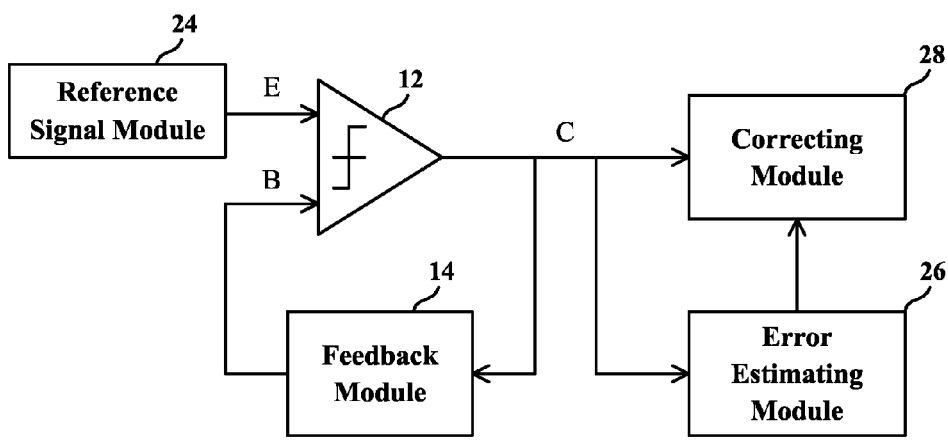
FIG. 8(A) through FIG. 8(C) and FIG. 9 show the examples for further including a correction function in the voltage converter according to the invention.
Figure 8B:
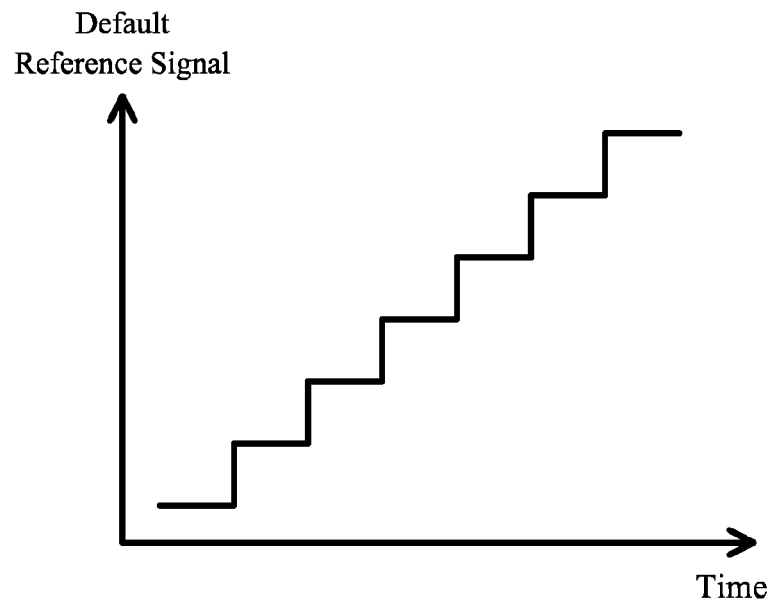

FIG. 8(A) illustrates an example that a correction function is included. As shown in FIG. 8(A), besides the comparator 12 and the feedback module 14, the voltage converter further includes a reference signal module 24, an error estimating module 26, and a correcting module 28. The reference signal module 24 provides a default reference signal E to the input end of the comparator 12 for receiving the analog input signal A. The voltage and the waveform of the default reference signal E are previously known. For instance, the reference signal module 24 can provide a stair-like signal shown in FIG. 8(B). The comparator 12 and the feedback module 14 can convert each of the voltage levels in the stair-like signal into a digital signal C, respectively. The error estimating module 26 is responsible for measuring the digital signal C generated based on the default reference signal E and comparing the digital signal C with a standard digital signal, so as to generate an estimated error. Subsequently, based on the estimated error, the correcting module 28 can correct the digital signal C converted from actual analog input signals A.

Figure 8C:
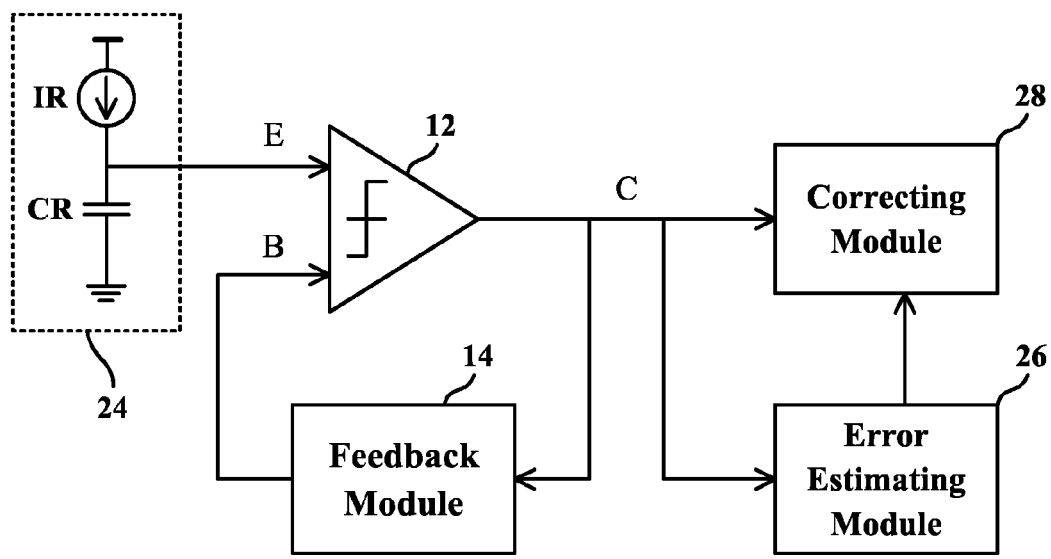

FIG. 8(C) shows an example of the reference signal module 24; a reference current source IR and a capacitor CR are included. The reference current source IR is used for charging the capacitor CR, so as to generate the default reference signal E. By controlling the current amount or charging time, the default reference signal E is adjustable. In practice, the correction procedure can be performed before the voltage converter starts to receive actual analog input signals A. The estimated error can be stored in the error estimating module 26 or the correcting module 28.

Figure 9:
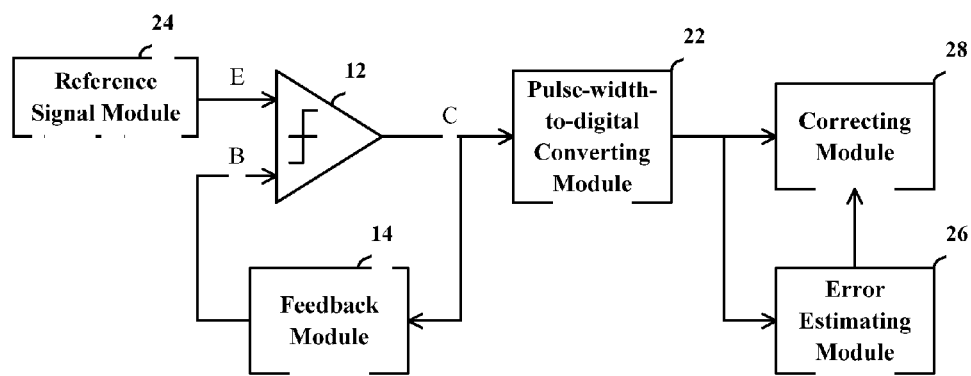

FIG. 9 illustrates an exemplary voltage converter having another correction function. In this embodiment, the error estimating module 26 measures the digital output signal generated based on the default reference signal E instead of the digital signal C. The error estimating module 26 also compares the digital output signal generated based on the default reference signal E with a standard digital signal, so as to generate an estimated error. Correspondingly, the correcting module 28 in this embodiment is used for correcting the digital output signal instead of the digital signal C. This architecture can achieve the goal of correcting conversion results, too.

Figure 10A:
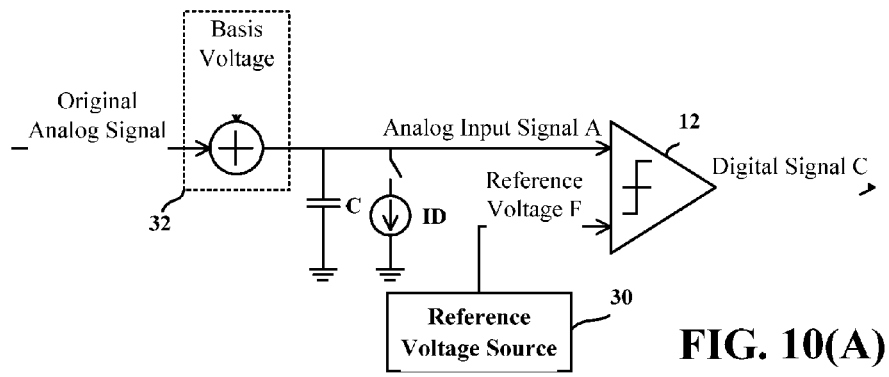
FIG. 10 shows the block diagram of the voltage converter in another embodiment according to the invention.

Another embodiment according to the invention is the voltage converter shown in FIG. 10(A). The voltage converter includes a comparator 12, a capacitor C, a current source ID, a reference voltage source 30, and a level-adjusting module 32. The voltage converter is used for converting an original analog signal to a digital signal. The reference voltage source 30 provides a reference voltage F. As shown in FIG. 10(A), the comparator 12 in this embodiment compares the analog input signal A with the reference voltage F, so as to generate the digital signal C.

When the analog input signal A is higher than the reference voltage F, the digital signal C has a first voltage level $V_1$. When the analog input signal A is lower than the reference voltage F, the digital signal C has a second voltage level $V_2$ different from the first voltage level $V_1$. Before the voltage conversion is started, the analog input signal A is stored on the capacitor C. After the voltage conversion is started, the current source ID charges or discharges the capacitor C until the analog input signal A is substantially equal to the reference voltage F. As described above, the pulse-width of the digital signal C is related to the amplitude of the analog input signal A. In practice, the current source ID can be replaced by a resistor or a switch coupled to the ground/voltage-supply node.

The level-adjusting module 32 in this example is an adder for summing up a basis voltage with the original analog signal, so as to generate the analog input signal A. It can be seen the pulse-width of the digital signal C is also related to the amplitude of the original analog signal. The function of the level-adjusting module 32 is similar to that of the level-adjusting module 18 in FIG. 5. Both the level-adjusting modules 32 and 18 are used for adjusting the pulse-width of the digital signal C, so as to keep the pulse-width of the digital signal C wider than a threshold. The difficulty in following processing or measuring the digital signal C can accordingly be reduced.

Figure 10B:
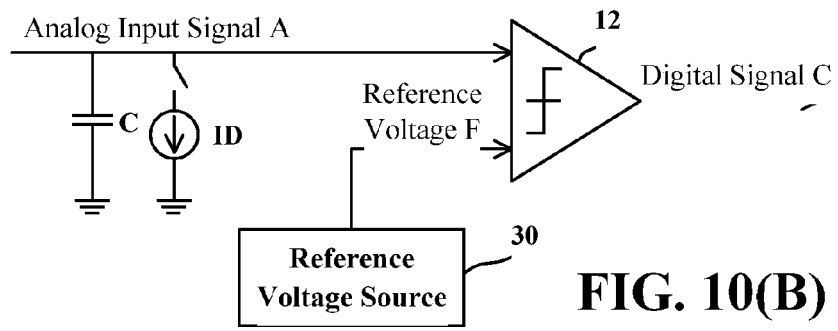
Figure 10C:
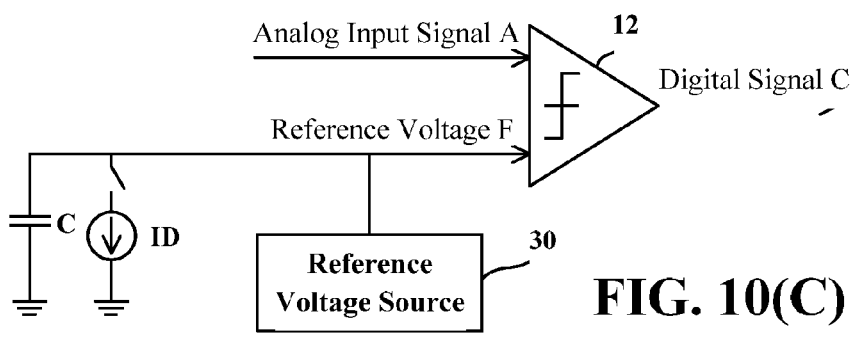
Figure 11:
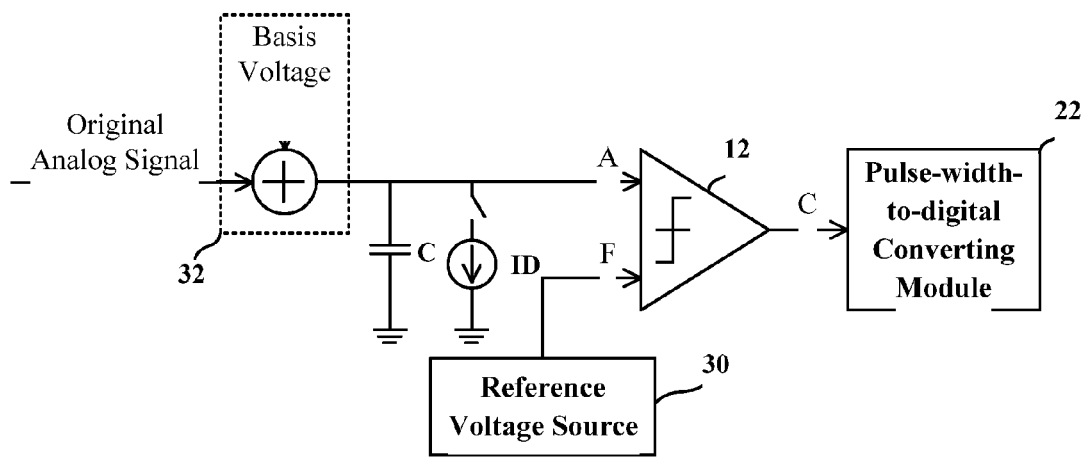
FIG. 11 shows an example for further including a pulse-width-to-digital converting module in the voltage converter according to the invention.
Figure 12:
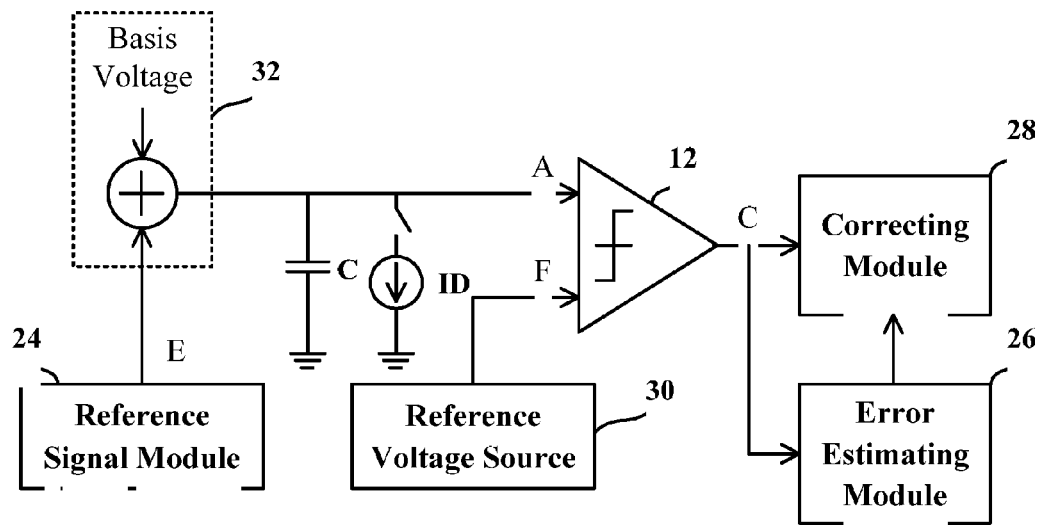
FIG. 12 shows an example for including a correction function in the voltage converter according to the invention.

As shown in FIG. 11, the voltage converter in FIG. 10(A) can further include a pulse-width-to-digital converting module 22 described above. Besides, as shown in FIG. 12, the voltage converter in FIG. 10 can also further include the reference signal module 24, error estimating module 26, and correcting module 28 described above. By utilizing the default reference signal E provided by the reference signal module 24, the digital signal C can be corrected by the error estimating module 26 and the correcting module 28. Furthermore, the reference signal module 24 can, as shown in FIG. 8(C), include a reference current source IR and a capacitor CR. When the voltage converter includes the pulse-width-to-digital converting module 22, the error estimating module 26 and the correcting module 28 can also be used for correcting the digital output signal generated by the pulse-width-to-digital converting module 22.

In practice, the goal of widening the pulse-width of the digital signal C can also be achieved by properly designing the reference voltage F. More specifically, the reference voltage F can be designed such that the pulse-width of the digital signal is kept wider than a threshold. The effect of changing the reference voltage F is equivalent to changing the relative voltage between the analog input signal A and the reference voltage F. The level-adjusting module 32 is not required in this architecture. The voltage converter can be designed as those illustrated in FIG. 10(B) and FIG. 10(C).

Figure 13A:
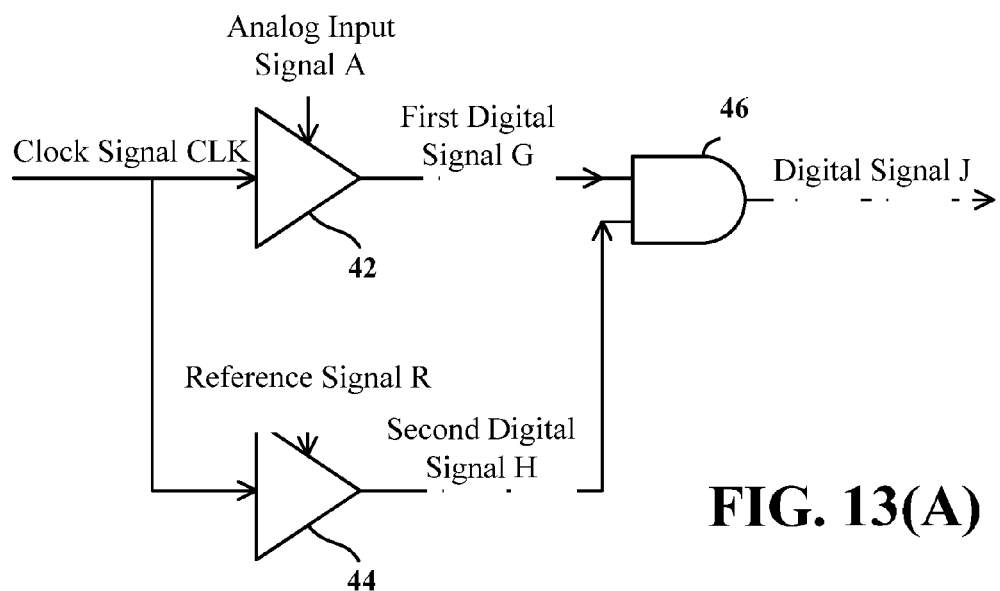
FIG. 13(A) and FIG. 13(D) show the block diagrams of the voltage converters in another two embodiments according to the invention.

Another embodiment according to the invention is the voltage converter shown in FIG. 13(A). The voltage converter is used for converting an analog input signal to a digital signal. The pulse-width of the digital signal is related to the amplitude of the analog input signal. This voltage converter includes a first converting module 42, a second converting module 44, and a comparing module 46. The first converting module 42 generates a first digital signal G based on the analog input signal A and a clock signal CLK. The second converting module 44 generates a second digital signal H based on a reference signal R and the clock signal CLK. In actual applications, the first converting module 42 and the second converting module 44 can respectively be, but not limited to, a voltage-controlled delay line.

Figure 13B:
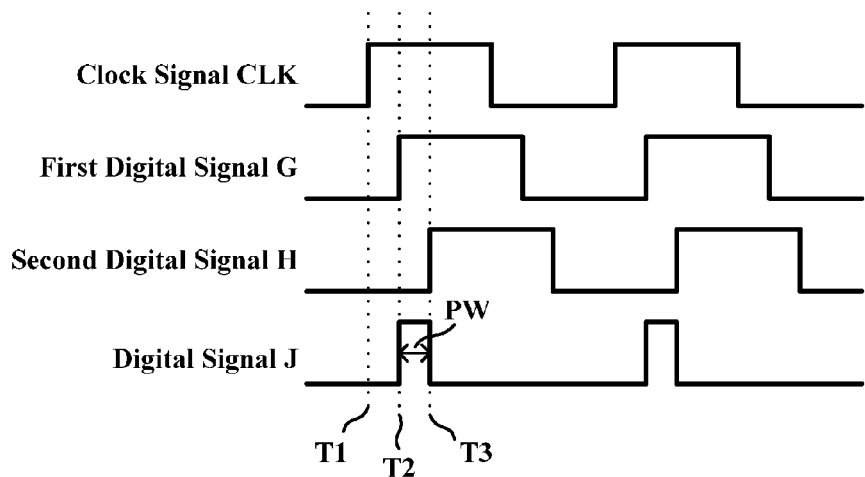
FIG. 13(B) and FIG. 13(C) are exemplary timing diagrams of the signals in the voltage converters.

In this embodiment, the periods of the first digital signal G and the second digital signal H are the same as the period of the clock signal CLK but have different phases. The phase of the first digital signal G is related to the analog input signal A. The phase of the second digital signal H is related to the reference signal R. For example, the first converting module 42 and the second converting module 44 can be designed to have an output signal with a larger delay than the clock signal CLK when its control voltage (i.e. the analog input signal A or the reference signal R) is higher. FIG. 13(B) illustrates an exemplary timing diagram of the aforementioned signals. It can be seen the rising edge of the clock signal CLK appears at time instant T1. Under the influence of the analog input signal A, the rising edge of the first digital signal G appears at time instant T2 later than time instant T1. Besides, under the influence of the reference signal R, the rising edge of the second digital signal H appears at time instant T3 later than time instant T1.

The comparing module 46 is used for comparing the first digital signal G and the second digital signal H, so as to generate a digital signal J. In this example, the rising edge of the digital signal J is triggered by the rising edge of the first digital signal G, and the falling edge of the digital signal J is triggered by the rising edge of the second digital signal H. Accordingly, the digital signal J has a high voltage level between time instances T2 and T3. The pulse-width PW of this high-level duration is related to the analog input signal A and the reference signal R. More specifically, the larger the voltage difference between the analog input signal A and the reference signal R is, the wider the pulse-width PW is. Since the reference signal R is known, the amplitude of the analog input signal A can be estimated based on the pulse-width PW of the digital signal J. In other words, the pulse-width of the digital signal J is related to the amplitude of the analog input signal A and can represent the amplitude level of the analog input signal A.

The pulse-width of the digital signal J can also be properly adjusted, so as to reduce the difficulty in processing or measuring the digital signal J. For instance, the voltage level of the reference signal R can be designed such that the pulse-width of the digital signal J is kept wider than a threshold. Taking the condition shown in FIG. 13(B) as an example, the voltage level of the reference signal R can be purposely designed as higher than the voltage level of the analog input signal A and having a voltage difference large enough, so that the time instant T3 is postponed and the length of the duration PW is increased.

Figure 13C:
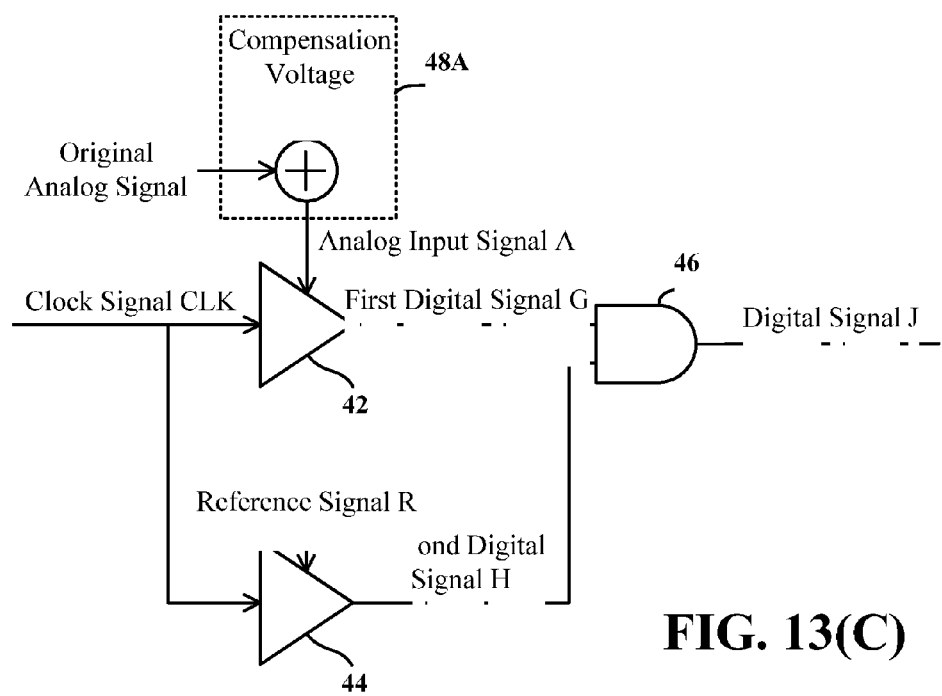

FIG. 13(C) illustrates another exemplary circuit capable of changing the pulse-width of the digital signal J. The voltage converter in this embodiment includes a compensating module 48A. As shown in FIG. 13(C), the analog input signal A provided to the first converting module 42 is the sum of a compensation voltage and an original analog signal. Actually, the voltage converter is used for converting the original analog signal. With the compensating module 48A, the common-mode voltage of the original analog signal can be properly adjusted. For example, the compensation voltage can be designed such that the pulse-width of the digital signal J is kept wider than a threshold. More specifically, adding the compensation voltage can increase the voltage difference between the original analog signal and the reference signal R, so as to widen the duration PW.

Figure 13D:
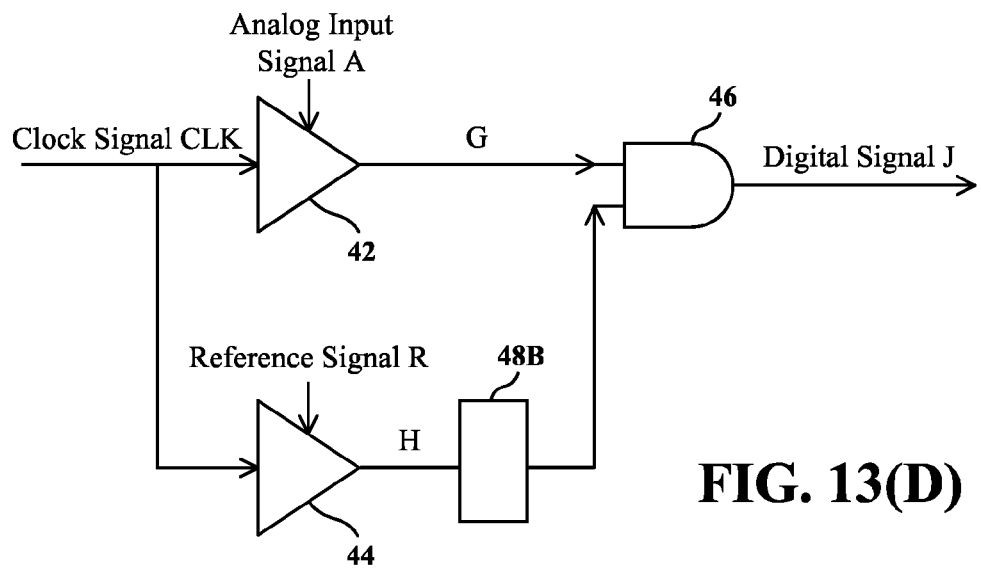

FIG. 13(D) illustrates another exemplary circuit for changing the pulse-width of the digital signal J. The time instant T3 in this example is postponed because of a time-domain delay provided to the second digital signal H by the compensating module 48B. As long as the time instant T3 is postponed, the duration PW is widened. In another embodiment, with a properly designed reference signal R, the compensating module 48B can also be arranged between the first converting module 42 and the comparing module 46. In other words, the compensating module 48B can also be used for changing the phase of the first digital signal G. Both the functions of the compensating module 48A and 48B can be viewed as providing a phase compensation to the first digital signal G or the second digital signal H, so as to keep the pulse-width of the digital signal J wider than a threshold.

Figure 14:
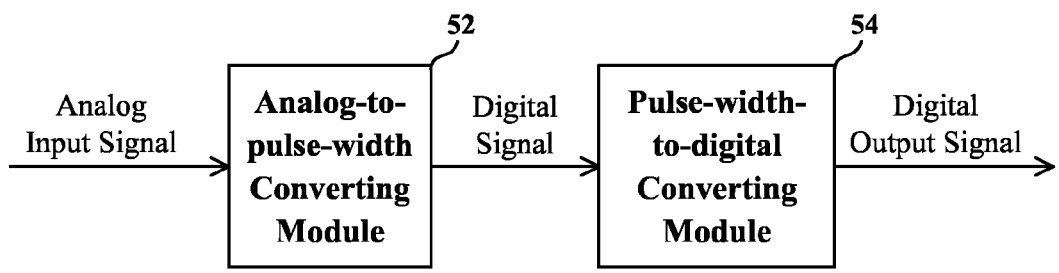
FIG. 14 shows the block diagram of an analog-to-digital converter in one embodiment according to the invention.

Another embodiment according to the invention is the analog-to-digital converter shown in FIG. 14. An analog-to-pulse-width converting module 52 and a pulse-width-to-digital converting module 54 are included in this analog-to-digital converter. The analog-to-pulse-width converting module 52 is used for converting an analog input signal to a digital signal. The pulse-width of the digital signal is related to the amplitude of the analog input signal. The pulse-width-to-digital converting module 54 generates a digital output signal corresponding to the pulse-width of the digital signal. The same as the voltage converter in FIG. 7, the analog-to-digital converter in this embodiment can provide two kinds of digital signals simultaneously. It is noted the analog-to-pulse-width converting module 52 is not limited to the circuits shown in FIG. 1(A) and FIG. 13(A).

Moreover, the analog-to-digital converter in FIG. 14 can also include the reference signal module 24, error estimating module 26, and correcting module 28 described above. By utilizing the default reference signal provided by the reference signal module 24, the digital signal generated by the analog-to-pulse-width converting module 52 or the digital output signal generated by the pulse-width-to-digital converting module 54 can be corrected by the error estimating module 26 and the correcting module 28.

Figure 15:
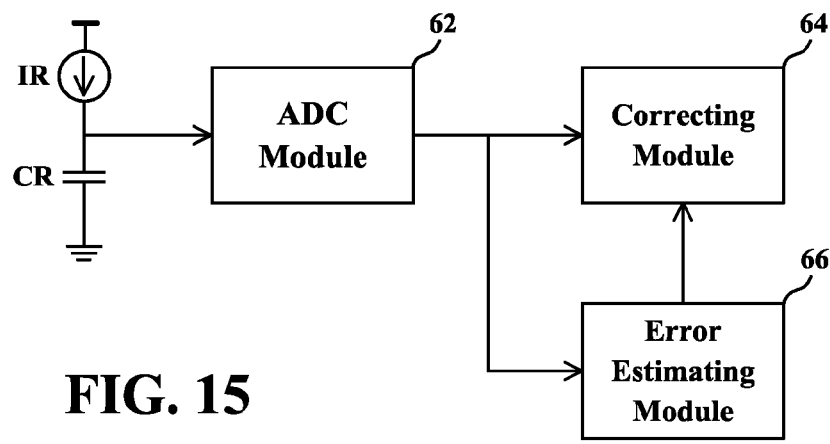
FIG. 15 shows the block diagram of an analog-to-digital converter in another embodiment according to the invention.

Another embodiment according to the invention is the analog-to-digital converter shown in FIG. 15. This analog-to-digital converter includes an analog-to-digital converting module 62, a reference current source IR, a capacitor CR, an error estimating module 64, and a correcting module 66. The analog-to-digital converting module 62 is used for converting an analog input signal to a digital output signal. The reference current source IR charges the capacitor CR, so as to generate a default reference signal as the analog input signal. The error estimating module 64 measures the digital output signal generated based on the default reference signal and compares the digital output signal with a standard digital signal, so as to generate an estimated error. Subsequently, the correcting module 66 corrects the digital output signal based on the estimated error. As shown in this embodiment, the correction method and correction circuits herein can be applied to all kinds of analog-to-digital converters, not limited to the circuit shown in FIG. 14.

In practice, the default reference signal is adjustable, and the reference current source can determine the charge amount or the charge duration for adjusting the default reference signal based on a clock signal. For example, the stair-like reference signal shown in FIG. 8(B) can be generated by adding a specific charge amount to the capacitor CR in each clock cycle.

Furthermore, the voltage converters in the aforementioned embodiments can be shared by plural different signal sources. For example, analog signals provided by different signal sources can be fed to the voltage converter in a time interleaved manner.

As described above, voltage converters capable of providing a digital signal with pulse-width corresponding to the amplitude of an analog signal are proposed in the invention. The voltage converters can further include a pulse-width-to-digital converting circuit, so as to provide two digital signals with different forms at the same time. Moreover, the architecture of the voltage converters according to the invention is simple and can be implemented easily. The hardware cost of analog-to-digital converters can accordingly be reduced.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A voltage converter for converting an analog input signal to a digital signal, the pulse-width of the digital signal being related to the amplitude of the analog input signal, the voltage converter comprising:
   a comparator for comparing the analog input signal and an analog feedback signal, so as to generate the digital signal; when the analog input signal is higher than the analog feedback signal, the digital signal having a first voltage level; when the analog input signal is lower than the analog feedback signal, the digital signal having a second voltage level different from the first voltage level; and
   a feedback module for resetting the analog feedback signal to an initial feedback voltage before the comparator starts to compare the analog input signal so that the pulse width of the digital signal is directly proportional to a difference of the analog input signal and the initial feedback voltage, and for adjusting the analog feedback signal based on the digital signal, so as to make the analog feedback signal approach the analog input signal.

2. The voltage converter of claim 1, wherein the feedback module comprises:

a capacitive component coupled between an input end of the comparator for receiving the analog feedback signal and a ground node;

a charge current source for selectively charging the capacitive component; and a discharge current source for selectively discharging the capacitive component.

3. The voltage converter of claim 2, further comprising:
a control circuit for controlling the charge current source and the discharge current source.

4. The voltage converter of claim 2, wherein the charge current source comprises a switch coupled to a power supply node.

5. The voltage converter of claim 2, wherein the discharge current source comprises a switch coupled to the ground node.

6. The voltage converter of claim 1, wherein the feedback module comprises:
a low-pass filter for filtering the digital signal, so as to generate the analog feedback signal.

7. The voltage converter of claim 6, further comprising:
a control circuit for controlling the low-pass filter according to the digital signal.

8. The voltage converter of claim 1, further comprising:
an estimating module for estimating the voltage value of the analog input signal based on an initial feedback voltage and the digital signal, wherein the initial feedback voltage is corresponding to an initial status of the analog feedback signal.

9. The voltage converter of claim 8, wherein the initial feedback voltage is generated based on the amplitude of a previous analog input signal.

10. The voltage converter of claim 1, wherein the feedback module further comprises:
a reset module for resetting the analog feedback signal to the initial feedback voltage before the voltage converter starts to convert the analog input signal.

11. The voltage converter of claim 10, wherein the initial feedback voltage is substantially zero, and the feedback module comprises:
a capacitive component coupled between an input end of the comparator for receiving the analog feedback signal and a ground node; and
a charge current source for charging the capacitive component when the digital signal has the first voltage level.

12. The voltage converter of claim 11, wherein the charge current source comprises a switch component coupled between the capacitive component and a power supply node; when the digital signal has the first voltage level, the switch component is turned on, so as to make the power supply node charge the capacitive component.

13. The voltage converter of claim 10, wherein the initial feedback voltage is a power supply voltage and the feedback module comprises:
a capacitive component coupled between an input end of the comparator for receiving the analog feedback signal and a ground node; and
a discharge current source for discharging the capacitive component when the digital signal has the second voltage level.

14. The voltage converter of claim 1, further comprising:
a sample-and-hold module, coupled to an input end of the comparator for receiving the analog input signal, for maintaining the analog input signal before the analog input signal is completely converted.

15. The voltage converter of claim 1, further comprising:
a pulse-width-to-digital converting module for generating a digital output signal corresponding to the pulse-width of the digital signal based on the digital signal.

16. The voltage converter of claim 1, further comprising:
a pulse-width-to-digital converting module for generating a digital output signal corresponding to the pulse-width of the digital signal based on the digital signal;
a reference signal module for providing a default reference signal as the analog input signal;
an error estimating module for measuring the digital signal generated based on the default reference signal and comparing the digital signal with a standard digital signal, so as to generate an estimated error; and
a correcting module for correcting the digital signal based on the estimated error.

17. The voltage converter of claim 1, wherein the pulse width of the digital signal is related to the amplitude of the analog input signal.

18. The voltage converter of claim 1, wherein the feedback module receives a clock to synchronize the operation of the comparator and the feedback module.

19. A voltage converter for converting an analog input signal to a digital signal, the pulse-width of the digital signal being related to the amplitude of the analog input signal, the voltage converter comprising:
a comparator for comparing the analog input signal and an analog feedback signal, so as to generate the digital signal; when the analog input signal is higher than the analog feedback signal, the digital signal having a first voltage level; when the analog input signal is lower than the analog feedback signal, the digital signal having a second voltage level different from the first voltage level;
a feedback module for adjusting the analog feedback signal based on the digital signal, so as to make the analog feedback signal approach the analog input signal; and
a level-adjusting module for adjusting the pulse width of the digital signal to be larger than a threshold value.

20. A voltage converter for converting an analog input signal to a digital signal, the pulse-width of the digital signal being related to the amplitude of the analog input signal, the voltage converter comprising:
a comparator for comparing the analog input signal and an analog feedback signal, so as to generate the digital signal; when the input signal is higher than the analog feedback signal, the digital signal having a first voltage level; when the analog input signal is lower than the analog feedback signal, the digital signal having a second voltage level different from the first voltage level;
a feedback module for adjusting the analog feedback signal based on the digital signal, so as to make the analog feedback signal approach the analog input signal;
a reference signal module for providing a default reference signal as the analog input signal;
an error estimating module for measuring the digital signal generated based on the default reference signal and comparing the digital signal with a standard digital signal, so as to generate an estimated error; and
a correcting module for correcting the digital signal based on the estimated error.

* * * * *